(12) United States Patent
Zhang

(10) Patent No.: US 10,082,438 B2
(45) Date of Patent: Sep. 25, 2018

(54) MULTI-SENSOR SYSTEM AND METHOD OF FORMING SAME

(71) Applicant: FREESCALE SEMICONDUCTOR, INC., Austin, TX (US)

(72) Inventor: Qing Zhang, Montreal (CA)

(73) Assignee: NXP USA, Inc., Austin, TX (US)

(*) Notice: Subject to any disclaimer, the term of this patent is extended or adjusted under 35 U.S.C. 154(b) by 488 days.

(21) Appl. No.: 14/700,424

(22) Filed: Apr. 30, 2015

(65) Prior Publication Data

US 2016/0320258 A1  Nov. 3, 2016

(51) Int. Cl.
| | | |
|---|---|---|
| G01P 15/125 | (2006.01) | |
| G01L 19/00 | (2006.01) | |
| B81C 1/00 | (2006.01) | |
| G01P 15/08 | (2006.01) | |

(52) U.S. Cl.
CPC ...... *G01L 19/0092* (2013.01); *B81C 1/00015* (2013.01); *G01P 15/0802* (2013.01); *G01P 15/125* (2013.01)

(58) Field of Classification Search
CPC ............ G01L 19/0092; G01P 15/0802; G01P 15/125; B81C 1/00015
See application file for complete search history.

(56) References Cited

U.S. PATENT DOCUMENTS

| | | | | |
|---|---|---|---|---|
| 5,291,534 A * | 3/1994 | Sakurai | ................. | G01D 3/0365 327/509 |
| 8,205,497 B1 * | 6/2012 | Okandan | ............ | G01C 19/5712 73/514.26 |
| 9,550,668 B1 * | 1/2017 | Xia | .......................... | H01L 29/84 |
| 2005/0189635 A1 * | 9/2005 | Humpston | ............ | B81B 7/0077 257/678 |
| 2006/0112765 A1 * | 6/2006 | Malvern | ................. | G01P 1/006 73/514.32 |
| 2007/0029629 A1 * | 2/2007 | Yazdi | .................. | B81C 1/00253 257/414 |
| 2007/0095148 A1 * | 5/2007 | Takahashi | .............. | G01D 21/02 73/754 |
| 2008/0315333 A1 * | 12/2008 | Combi | .................. | B81B 7/0061 257/415 |
| 2010/0117167 A1 * | 5/2010 | Yokura | .................... | G01P 1/023 257/415 |
| 2010/0242603 A1 * | 9/2010 | Miller | ....................... | B81B 7/02 73/514.32 |
| 2011/0126632 A1 * | 6/2011 | McNeil | ..................... | B81B 7/02 73/718 |
| 2012/0043627 A1 * | 2/2012 | Lin | .......................... | B81B 7/02 257/415 |
| 2012/0266460 A1 * | 10/2012 | Lee | .......................... | G01P 15/08 29/829 |
| 2012/0318060 A1 * | 12/2012 | Ruby | .................... | G01P 15/125 73/514.32 |

(Continued)

*Primary Examiner* — David Bolduc

(57) ABSTRACT

A method for forming a multi-sensor system includes forming an inertial sensor fixed electrode of an inertial sensor and a movable electrode of a pressure sensor on a first substrate having through silicon vias (TSVs). A second substrate is fusion bonded to a bonding layer on the first substrate. The second substrate and the bonding layer are patterned to form a transducer layer of the inertial sensor and a pressure sensor fixed electrode of the pressure sensor. The first substrate is etched to form a pressure sensor port aligned with the movable electrode.

7 Claims, 8 Drawing Sheets

(56) References Cited

U.S. PATENT DOCUMENTS

| | | | |
|---|---|---|---|
| 2013/0220016 A1* | 8/2013 | Simoni | B81C 1/00198 |
| | | | 73/514.32 |
| 2013/0283912 A1* | 10/2013 | Lin | G01P 15/0802 |
| | | | 73/514.16 |
| 2013/0340525 A1 | 12/2013 | Liu | |
| 2014/0175572 A1* | 6/2014 | Hsu | B81B 3/0086 |
| | | | 257/415 |
| 2014/0264648 A1* | 9/2014 | Chu | B81C 1/00134 |
| | | | 257/415 |
| 2014/0268524 A1* | 9/2014 | Gogoi | H01L 27/14 |
| | | | 361/679.01 |
| 2015/0096376 A1* | 4/2015 | Feyh | B81B 7/02 |
| | | | 73/514.16 |
| 2015/0145610 A1* | 5/2015 | Ruby | H03H 9/10 |
| | | | 331/107 R |
| 2016/0137491 A1* | 5/2016 | Su | B81B 7/02 |
| | | | 257/418 |

* cited by examiner

MULTI-SENSOR SYSTEM AND METHOD OF FORMING SAME

FIELD

This disclosure relates generally to sensor devices, and more specifically, to integrated pressure and inertial sensors.

BACKGROUND

Micro-Electro-Mechanical-System (MEMS) devices include MEMS pressure sensors and MEMS inertial sensors. A MEMS pressure sensor measures pressure, e.g., by measuring movement of a pressure sensing diaphragm.

A MEMS inertial sensor is a device that performs measurement by using inertia. Examples of MEMS inertial sensors include accelerometers and gyroscopes.

In certain applications, a MEMS pressure sensor is used in combination with a MEMS inertial sensor. Typically, a discrete MEMS pressure sensor is packaged with a discrete MEMS inertial sensor to provide the combined functionality of a pressure sensor and an inertial sensor. However, providing the MEMS pressure sensor and the MEMS inertial sensor as discrete components increases device footprint and requires complex electrical connection schemes and control electronics.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
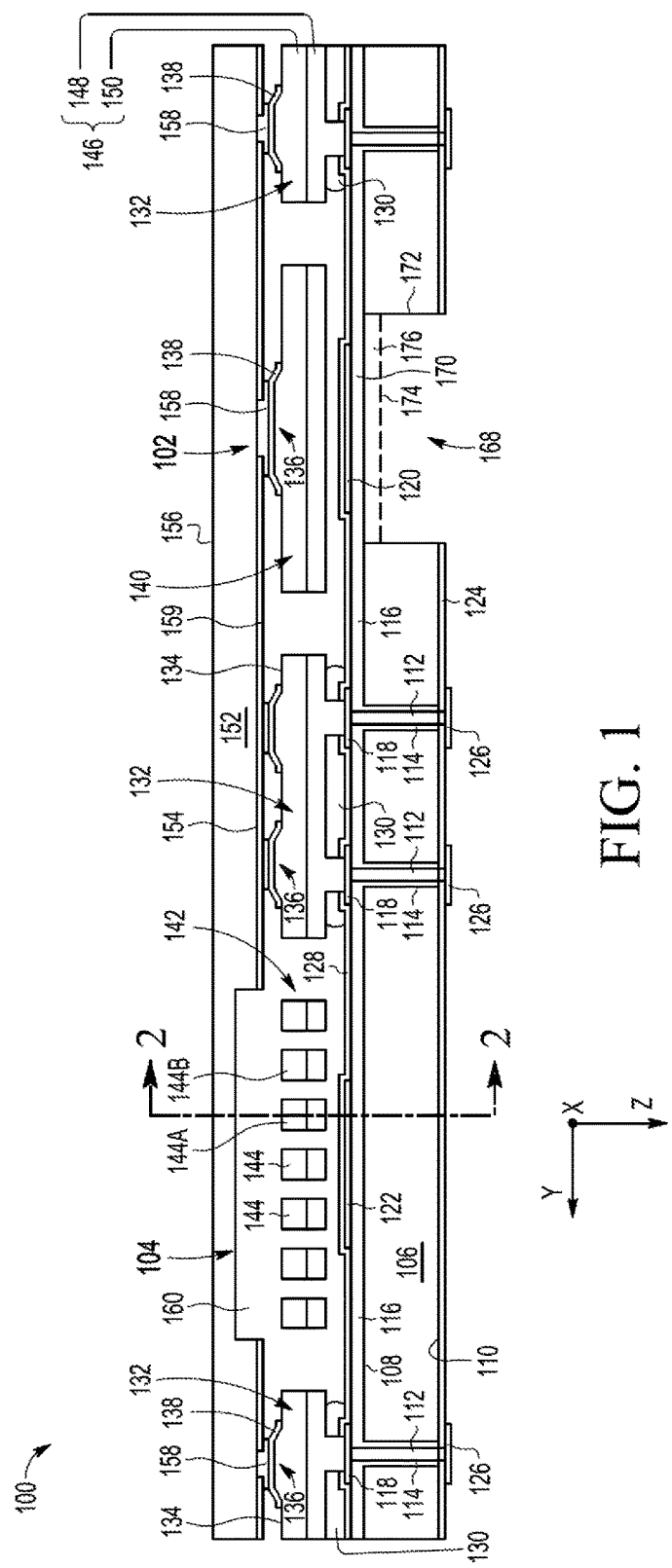
FIG. 1 is a cross-sectional view of a multi-sensor system in accordance with one embodiment.

As an overview and in accordance with one embodiment, referring to FIG. 1, a multi-sensor system 100 includes a first substrate 106, a pressure sensor 102, and an inertial sensor 104. Pressure sensor 102 includes a movable electrode 120 aligned with a pressure sensor port 168 within first substrate 106 and a pressure sensor fixed electrode 140 including a portion, e.g., a first portion, of a second substrate 150. Inertial sensor 104 includes an inertial sensor fixed electrode 122 on first substrate 106 and a transducer layer 142 including a portion, e.g., a second portion, of second substrate 150.

By simultaneously forming and monolithically integrating inertial sensor 104 and pressure sensor 102 into multi-sensor system 100, the footprint of multi-sensor system 100 as well as the fabrication cost thereof is minimized.

Now in more detail, FIG. 1 is a cross-sectional view of a multi-sensor system 100 in accordance with one embodiment. Multi-sensor system 100 includes a Micro-Electro-Mechanical-System (MEMS) pressure sensor 102 and a MEMS inertial sensor 104 integrated within multi-sensor system 100 as described further below.

In accordance with this embodiment, multi-sensor system 100 includes a first substrate 106 having an inner, e.g., first, surface 108 and an outer, e.g., second, surface 110 opposite inner surface 108. First substrate 106, sometimes called a silicon substrate or a Through Silicon Via (TSV) wafer, is formed of a semiconductor material including monocrystalline (single crystal) silicon although is formed of other materials in other embodiments.

Extending through first substrate 106 between inner surface 108 and outer surface 110 are electrically conductive vias 112, sometimes called Through Silicon Vias (TSVs). In one embodiment, vias 112 are formed of electrically conductive polysilicon, although are formed of other electrically conductive materials in other embodiments. To electrically isolate vias 112 from the bulk of first substrate 106, dielectric via liners 114 surround vias 112 and are located between vias 112 and the bulk of first substrate 106.

Located on inner surface 108 is an insulation layer 116. In one embodiment, insulation layer 116 is formed of silicon oxide although is formed of other dielectric materials in other embodiments.

Located on insulation layer 116 are electrically conductive lands 118, a movable electrode 120 of pressure sensor 102, and a fixed electrode 122 of inertial sensor 104. In one embodiment, movable electrode 120 and fixed electrode 122 are parts of the same layer. Fixed electrode 122 is sometimes called an inertial sensor fixed electrode 122. Lands 118, sometimes called upper or first lands 118, are formed on and electrically connected to vias 112 that extend through insulation layer 116 to contact lands 118. Further, electrodes 120, 122 are electrically connected to lands 118 and thus vias 112 by electrically conductive traces formed on insulation layer 116 or otherwise as discussed further below.

Located on lower surface 110 is a lower, e.g. first, passivation layer 124. In one embodiment, lower passivation layer 124 is formed of silicon nitride although is formed of other dielectric materials in other embodiments. Lands 126, sometimes called lower or second lands 126, are formed on lower passivation layer 124. Lands 126 extend through openings in lower passivation layer 124 to contact and be electrically connected to vias 112. Lands 126 and generally vias 112 provide the input/output (I/O) structure through which signals are input and output from pressure sensor 102 and inertial sensor 104 of multi-sensor system 100 during operation in one embodiment.

Located on lands 118, movable electrode 120, fixed electrode 122, and insulation layer 116 is a dielectric upper, e.g., second, passivation layer 128. Located on upper passivation layer 128 is a dielectric sacrificial layer 130. In one embodiment, upper passivation layer 128 is formed of a material that is selectively etchable relative to sacrificial layer 130. For example, upper passivation layer 128 is formed of silicon nitride and sacrificial layer 130 is formed of silicon oxide although layers 128, 130 are formed of other dielectric materials in other embodiments.

An electrically conductive connecting structure 132 is formed on sacrificial layer 130. Connecting structure 132 extends through openings in sacrificial layer 130 and upper passivation layer 128 to contact and be electrically connected to lands 118. Connecting structure 132 at least partially overhangs sacrificial layer 130 such that a vertical empty space exists between connecting structure 132 and upper passivation layer 128 although there is no overhang in other embodiments.

Connecting structure 132 includes a principal surface 134 which is planar. Connecting structure 132 further includes posts 136, sometimes called protrusions or silicon posts, protruding from principal surface 134 in a direction opposite first substrate 106.

An electrical contact layer 138 is formed on posts 136. For example, electrical contact layer 138 is a germanium thin film that serves as an electrical contact to a third substrate as discussed further below although is formed of other electrically conductive materials in other embodiments.

Multi-sensor system 100 further includes a fixed electrode 140 of pressure sensor 102 and a transducer layer 142 of inertial sensor 104. Fixed electrode 140, sometimes called a pressure sensor fixed electrode 140, also includes principal surface 134 and one or more posts 136 protruding from principal surface 134. Electrical contact layer 138 is formed on post 136 of fixed electrode 140.

Transducer layer 142 includes a plurality of discrete elements 144, one or more of which are movable as discussed below.

In accordance with this embodiment, connecting structure 132, fixed electrode 140, and transducer layer 142 are parts of a multilayer structure 146, e.g., a bilayer structure, which has been patterned. Multilayer structure 146 includes a bonding layer 148 and a second substrate 150, sometimes called a MEMS structural layer. Generally, bonding layer 148 and second substrate 150 are formed of materials that can be bonded together, e.g., by a fusion bonding process. In accordance with one particular embodiment, bonding layer 148 is an electrically conductive polysilicon layer and second substrate 150 is formed of an electrically conductive semiconductor material including monocrystalline silicon.

Multi-sensor system 100 further includes a third substrate 152. Third substrate 152 is formed of an electrically conductive semiconductor material including monocrystalline silicon although is formed of other materials in other embodiments. Third substrate 152 includes an inner, e.g., first, surface 154 and an outer, e.g., second, surface 156 opposite inner surface 154.

Inner surface 154 of third substrate 152 is bonded to electrical contact layer 138 through contact pads 158. For example, contact pads 158 are aluminum that are formed on inner surface 154 and bonded to electrical contact layer 138, e.g., through aluminum germanium (AlGe) eutectic bonding.

Third substrate 152 is thus bonded to connecting structure 132, which in turn is bonded to first substrate 106, to form one or more enclosures around fixed electrode 140 and transducer layer 142. In this manner, fixed electrode 140 and transducer layer 142 are protected from the ambient environment. Generally, third substrate 152 seals inertial sensor 104 and provides a hermetic reference cavity for pressure sensor 102.

In one embodiment, third substrate 152 is grounded and thus operates as a ground plane. In another embodiment, third substrate 152 includes a passivation layer 159 with openings on inner surface 154 and a network of conductors on passivation layer 159, e.g., traces, that propagate signals, e.g., to contact pads 158 and generally to vias 112.

In accordance with this embodiment, a transducer layer cavity 160 is formed in inner surface 154 of third substrate 152. Transducer layer cavity 160 is aligned with and overlaps transducer layer 142. Transducer layer cavity 160 increases the space between transducer layer 142 and third substrate 152. In this manner, inadvertent contact between third substrate 152 and transducer layer 142 is avoided thus ensuring free movement of elements 144 of transducer layer 142. For example, elements 144 include one or more movable elements 144A and one or more fixed elements 144B. Movable element 144A is movable whereas fixed element 144B is fixed in position.

Figure 2:
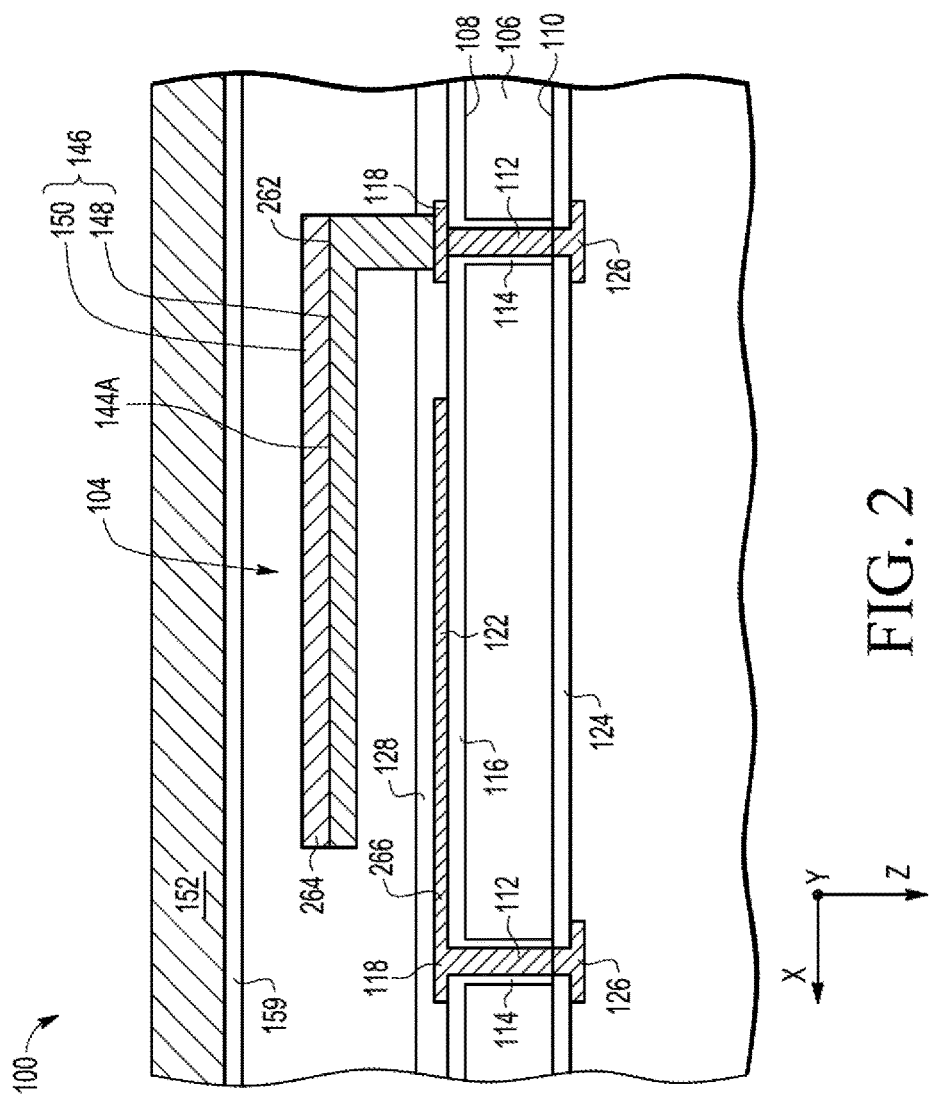
FIG. 2 is a cross-sectional view of the multi-sensor system of FIG. 1 along the line II-II illustrating a movable element of a transducer layer in accordance with one embodiment.

FIG. 2 is a cross-sectional view of multi-sensor system 100 of FIG. 1 along the line II-II illustrating movable element 144A of transducer layer 142 in accordance with one embodiment. Referring now to FIGS. 1 and 2 together, movable element 144A is connected to a respective land 118 at a connected end 262 thereof. Movable element 144A projects from connected end 262 as a cantilever beam to a free end 264. Free end 264 floats and is movable between first substrate 106 and third substrate 152.

As also illustrated in FIG. 2, fixed electrode 122 of inertial sensor 104 is also connected to a respective land 118, e.g., by an electrically conductive trace 266. Although fixed electrode 122 is illustrated and discussed as being electrically connected to a respective land 118 by trace 266 and movable element 144A is illustrated as also being directly connected to a respective land 118, this is illustrative only. Fixed electrode 122 can be interconnected to a respective land 118 using any one of a number of different electrically conductive pathways or directly thereto. In addition, transducer layer 142 can be interconnected to respective lands using any one of a number of different electrically conductive pathways, e.g., through conductors of third substrate 152.

During operation, due to inertia, movable element 144A moves. For example, movable element 144A moves in the X-Y or Z direction. The X-Y direction is a direction in a plane parallel to fixed electrode 122, e.g., to the left and right in the view of FIG. 1 and in and out of the plane of the page of FIG. 2. The Z direction is in a direction perpendicular to fixed electrode 122, e.g., up and down in the view of FIGS. 1 and 2.

Fixed element 144B is similar to movable element 144A although it is fixed in position to first substrate 106 and relative to movable element 144A. For example, fixed element 144B has ends that are similar to ends 262, 264 of movable element 144A except that both ends are fixed to lands 118 or otherwise to first substrate 106 and/or third substrate 152.

As movable element 144A moves in the X-Y direction, the distance between movable element 144A and fixed element 144B changes, e.g., increases or decreases. As the distance between movable element 144A and fixed element 144B changes, the capacitance between movable element 144A and fixed element 144B changes. This change in capacitance is measured to detect changes in inertia in the X-Y direction.

Further, as movable element 144A moves in the Z direction, the distance between movable element 144A and fixed electrode 122 changes, e.g., increases or decreases. As the distance between movable element 144A and fixed electrode 122 changes, the capacitance between movable element 144A and fixed electrode 122 changes. This change in capacitance is measured to detect changes in inertia in the Z direction.

Although one simplistic example of structure and use of a movable element 144A, a fixed element 144B, and fixed electrode 122 to measure inertia is illustrated in FIGS. 1 and 2, in light of this disclosure, those of skill in the art will understand that the example is merely illustrative. Transducer layer 142 and fixed electrode 122 measure inertia using any one of a number of suitable structural configurations depending upon the particular application.

Referring again to FIG. 1, extending through first substrate 106 between outer surface 110 and inner surface 108 is a pressure sensor port 168. Pressure sensor port 168 is aligned within and overlaps movable electrode 120 of pressure sensor 102. In accordance with the particular embodiment illustrated in FIG. 1, pressure sensor port 168 extends entirely through first substrate 106 such that a pressure sensing diaphragm portion 170 of insulation layer 116 is exposed to the ambient environment through pressure sensor port 168. Accordingly, pressure sensor port 168 is defined by a sidewall 172 of first substrate 106 extending between outer surface 110 and inner surface 108 and pressure sensing diaphragm portion 170 of insulation layer 116.

Movable electrode 120 is located on pressure sensing diaphragm portion 170 opposite of pressure sensor port 168. Pressure sensing diaphragm portion 170 forms the pressure sensing diaphragm of pressure sensor 102 in accordance with this embodiment.

During operation, changes in pressure in the ambient environment move pressure sensing diaphragm portion 170 and thus movable electrode 120 located thereon. Movable electrode 120 is connected to a land 118. e.g., by a trace similar to trace 266 as illustrated in FIG. 2. Movement of movable electrode 120 changes the distance between movable electrode 120 and fixed electrode 140, e.g., increases or decreases the distance. As the distance between movable electrode 120 and fixed electrode 140 changes, the capacitance between movable electrode 120 and fixed electrode 140 changes. This change in capacitance is measured to measure the ambient pressure within pressure sensor port 168.

In accordance with another embodiment, pressure sensor port 168 extends only partially through first substrate 106 as indicated by the dashed line 174. More particularly, a pressure sensing diaphragm portion 176 of first substrate 106 remains. Illustratively, pressure sensing diaphragm portion 176 is 5-20 µm thick. Pressure sensing diaphragm portion 176 in combination with pressure sensing diaphragm portion 170 of insulation layer 116 form the pressure sensing diaphragm of pressure sensor 102 in accordance with this embodiment.

Due to the increased thickness associated with pressure sensing diaphragm portion 176 of substrate 106, greater pressure is required to move movable electrode 120. Accordingly, by selecting a suitable thickness of pressure sensing diaphragm portion 176 of substrate 106, pressure sensor 102 can be designed to measure a wide range of pressures, for example, as discussed in relation to FIG. 3.

Figure 3:
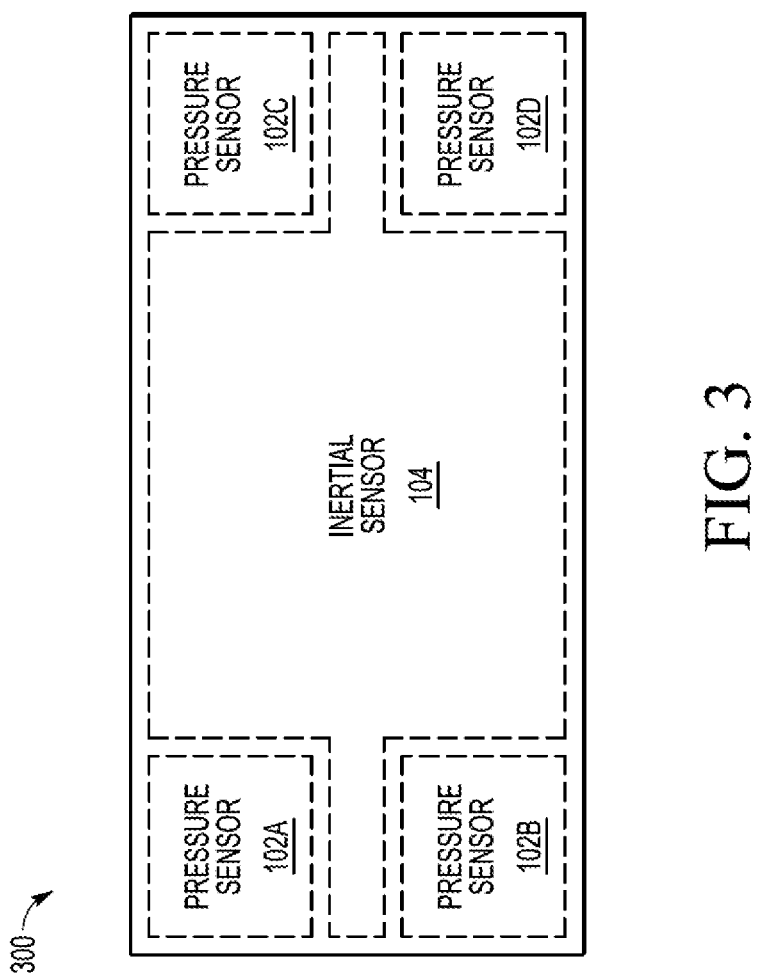
FIG. 3 is a top plan view of a multi-sensor system in accordance with another embodiment.

FIG. 3 is a top plan view of a multi-sensor system 300 in accordance with another embodiment. Multi-sensor system 300 of FIG. 3 is similar to multi-sensor system 100 of FIG. 1 but includes a plurality of pressure sensors 102A, 102B, 102C, 102D and an inertial sensor 104. Pressure sensors 102A, 102B, 102C, 102D have different thicknesses of pressure sensing diaphragm portions 176 of substrate 106 (illustrated in FIG. 1), or an absence of pressure sensing diaphragm portion 176, to allow different pressures to be measured in a single multi-sensor system 300. In another embodiment, the thicknesses of pressure sensing diaphragm portions 176 are the same but other diaphragm dimensions are different, e.g., the diameters of pressure sensing diaphragm portions 176 are different, to allow different pressures to be measured in a single multi-sensor system 300. Accordingly, multiple pressure sensors 102A, 102B, 102C, 102D designed for different pressure ranges and inertial sensor 104 are placed in a single chip in accordance with the embodiment illustrated in FIG. 3.

Figure 4:
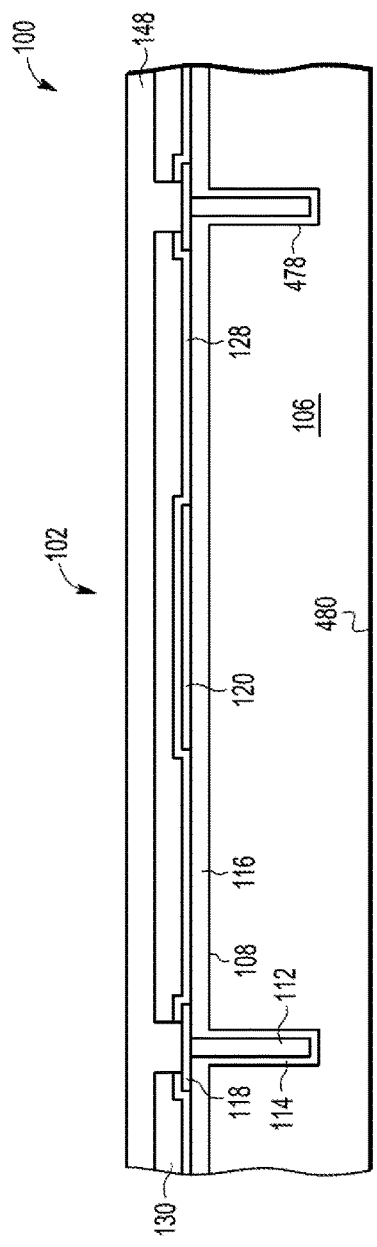
FIG. 4 is a cross-sectional view of a pressure sensor of the multi-sensor system of FIG. 1 during fabrication in accordance with one embodiment.
Figure 5:
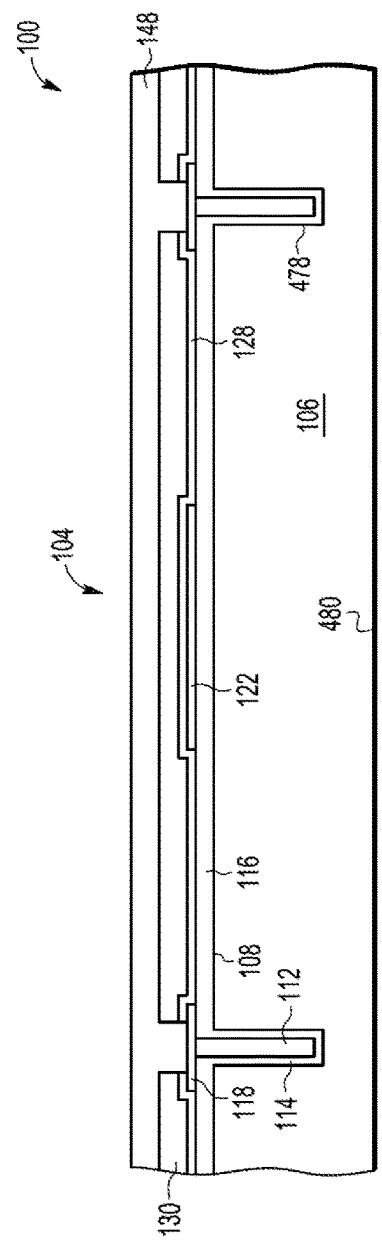
FIG. 5 is a cross-sectional view of an inertial sensor of the multi-sensor system of FIG. 1 during fabrication in accordance with one embodiment.

FIGS. 4 and 5 are cross-sectional views of pressure sensor 102 and inertial sensor 104 of multi-sensor system 100 of FIG. 1 during fabrication in accordance with one embodiment. Pressure sensor 102 and inertial sensor 104 are illustrated in separate FIGS. 4 and 5 to allow features thereof to be dearly illustrated although it is to be understood that pressure sensor 102 and inertial sensor 104 are fabricated simultaneously and integrally as part of multi-sensor system 100 as in the view of FIG. 1 for example. Accordingly, FIGS. 4 and 5 illustrate sections of a single integral multi-sensor system 100 during fabrication.

Referring now to FIGS. 4 and 5 together, first substrate 106 is provided. TSV openings 478 are formed extending into first substrate 106 from inner surface 108 thereof. TSV openings 478 are formed by etching in one embodiment although are formed using other techniques such as mechanical or laser drilling in other embodiments. TSV openings 478 extend partially through first substrate 106 such that a portion of first substrate 106 exists between TSV openings 478 and an outer sacrificial surface 480 of first substrate 106.

Dielectric via liners 114 are formed within TSV openings 478. Further, insulation layer 116 is formed on inner surface 108 of first substrate 106. Illustratively, via liners 114 are formed simultaneously with insulation layer 116 by oxidizing the silicon of first substrate 106 to form silicon oxide.

Dielectric via liners 114 and generally TSV openings 478 are filled with vias 112. In one embodiment, polysilicon is blanket deposited to fill via liners 114 and cover insulation layer 116. The overburdened polysilicon on insulation layer 116 is then removed, e.g., by using chemical mechanical polishing (CMP).

Movable electrode 120, fixed electrode 122, and lands 118 are formed e.g., of electrically conductive polysilicon, on insulation layer 116 as well as any electrically interconnecting structures such as traces 266 (see FIG. 2 for example). Movable electrode 120, fixed electrode 122, and lands 118 are formed subsequent to formation of vias 112 although in another embodiment, vias 112, movable electrode 120, fixed electrode 122, and lands 118 are formed simultaneously or in a different order.

Upper passivation layer 128. e.g., silicon nitride, is blanket formed, e.g., deposited, on lands 118, movable electrode 120, fixed electrode 122, and the exposed portions of insulation layer 116. Sacrificial layer 130, e.g., silicon oxide, is blanket formed, e.g., deposited, on upper passivation layer 128. Electrodes 120, 122 and sacrificial layer 130 are built on first substrate 106.

Upper passivation layer 128 and sacrificial layer 130 are patterned to create openings on top of vias 112 and to expose lands 118. Bonding layer 148, e.g., electrically conductive polysilicon, is blanket formed, e.g., deposited, on sacrificial layer 130. Bonding layer 148 fills the openings in upper passivation layer 128 and sacrificial layer 130 and directly contacts and is electrically connected to lands 118. Bonding layer 148 is polished, e.g., by CMP.

Figure 6:
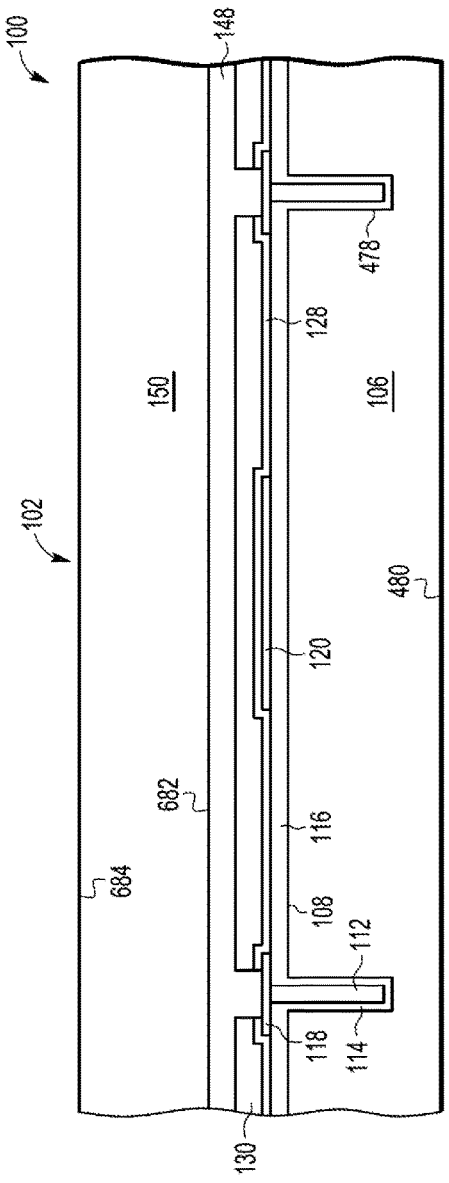
FIGS. 6 and 7 are cross-sectional views of the pressure sensor and the inertial sensor of FIGS. 4 and 5, respectively, at a further stage during fabrication in accordance with one embodiment.
Figure 7:
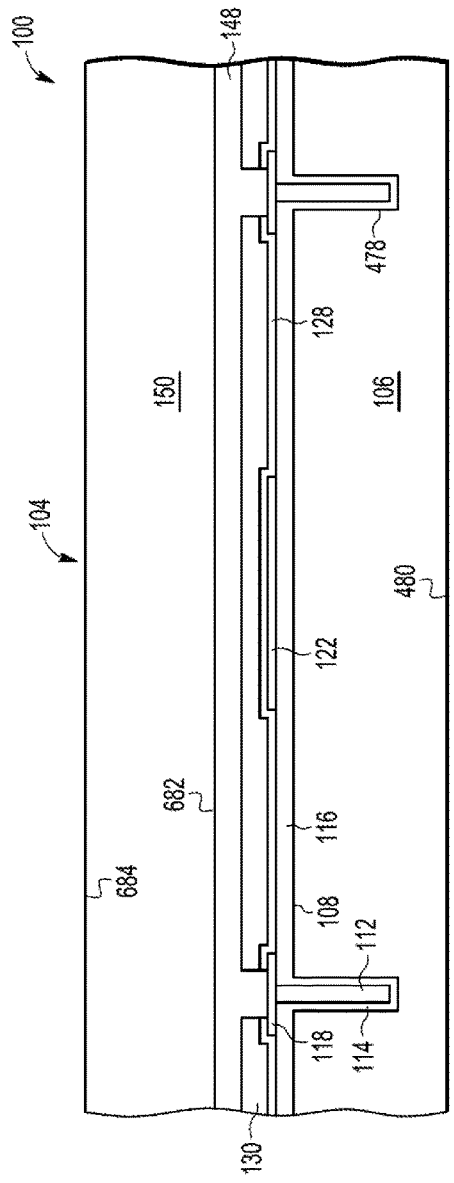

FIGS. 6 and 7 are cross-sectional views of pressure sensor 102 and inertial sensor 104 of FIGS. 4 and 5, respectively, at a further stage during fabrication in accordance with one embodiment. Referring now to FIGS. 6 and 7, second substrate 150 is bonded to bonding layer 148. Bonding layer 148 is used as the bonding layer for bonding second substrate 150. More particularly, the structure is heated to fusion bond bonding layer 148, e.g., polysilicon, to second substrate 150, e.g., single-crystal silicon. Illustratively, the structure is heated to approximately 1000° C. to fusion bond second substrate 150 to bonding layer 148. Accordingly, a lower, e.g., first, surface 682 of second substrate 150 is fusion bonded to bonding layer 148.

Second substrate 150 is then thinned down from an upper, e.g., second, surface 684 of second substrate 150. For example, upper surface 684 is ground down followed by CMP. Illustratively, second substrate 150 is thinned to provide a suitable thickness, e.g., 20 to 50 μm, for transducer layer 142 that is to be subsequently formed as described below. In one embodiment, by using single-crystal silicon as second substrate 150, the stress level of second substrate 150 is very low, e.g., almost zero, and generally lower than deposited polysilicon. For example, forming second substrate 150 of single-crystal silicon achieves a low stress in second substrate 150 even in the case when the thickness of second substrate 150 is 25 μm or more.

Figure 8:
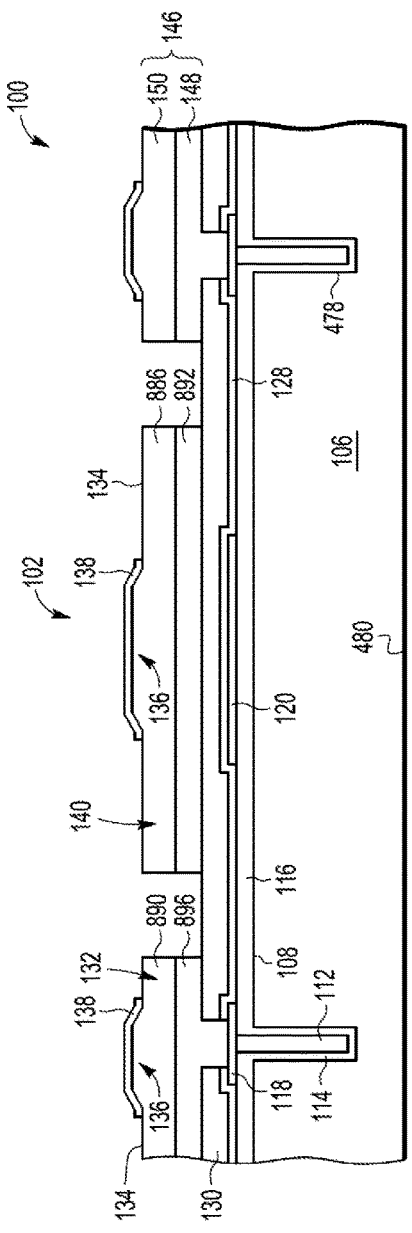
FIGS. 8 and 9 are cross-sectional views of the pressure sensor and the inertial sensor of FIGS. 6 and 7, respectively, at a further stage during fabrication in accordance with one embodiment.
Figure 9:
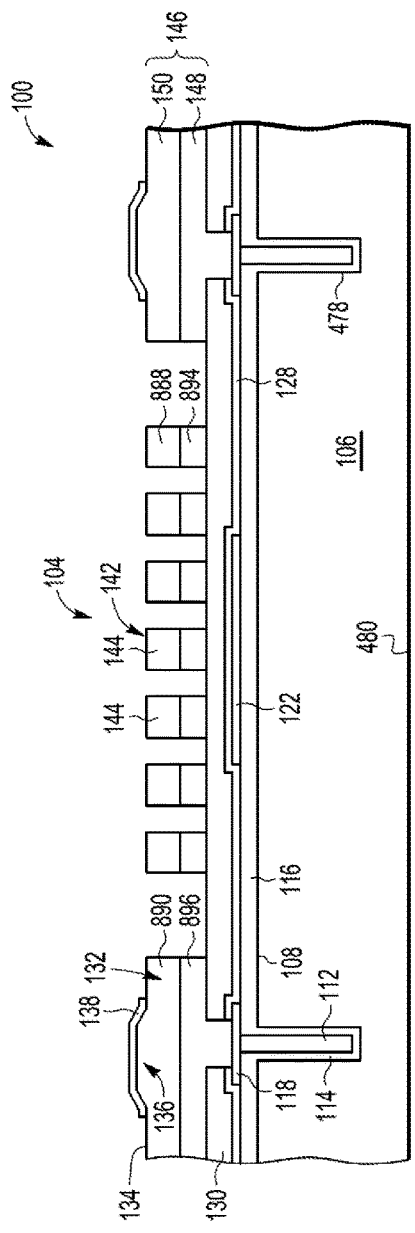

FIGS. 8 and 9 are cross-sectional views of pressure sensor 102 and inertial sensor 104 of FIGS. 6 and 7, respectively, at a further stage during fabrication in accordance with one embodiment. Referring now to FIGS. 8 and 9, second substrate 150 is patterned, e.g., using wet etching, to create posts 136. In one embodiment, a mask is formed on upper surface 684 and the remaining unmasked portions are removed, e.g., using a wet etch process, to form posts 136. The mask is then removed.

Electrical contact layer 138, e.g., germanium, is formed on posts 136. Illustratively, germanium is blanket deposited and then patterned to form electrical contact layer 138 remaining on top of posts 136 only. Electrical contact layer 138 serves as the electrical contact to third substrate 152 as discussed further below.

Second substrate 150 is patterned, e.g., using deep reactive ion etching (DRIE), to create a second substrate fixed electrode portion 886, a second substrate transducer layer portion 888, and a second substrate connecting structure portion 890. Second substrate transducer layer portion 888 is sometimes called a high aspect ratio structure, e.g., the created gaps are in the range of 0.8 to 2.0 μm in one example.

Second substrate fixed electrode portion 886, second substrate transducer layer portion 888, and second substrate connecting structure portion 890 will be included within fixed electrode 140 of pressure sensor 102, transducer layer 142 of inertial sensor 104, and connecting structure 132 as discussed further below. Generally, second substrate 150 is pattered to form fixed electrode 140 of pressure sensor 102, transducer layer 142 of inertial sensor 104, and connecting structure 132.

The patterned second substrate 150 is then used as an etch mask to pattern bonding layer 148, e.g., again using DRIE. Thus, bonding layer 148 is etched together with second substrate 150. More particularly, bonding layer 148 is patterned to create a bonding layer fixed electrode portion 892, a bonding layer transducer layer portion 894, and a bonding layer connecting structure portion 896. Bonding layer fixed electrode portion 892, bonding layer transducer layer portion 894, and bonding layer connecting structure portion 896 will be included within fixed electrode 140 of pressure sensor 102, transducer layer 142 of inertial sensor 104, and connecting structure 132.

More particularly, second substrate fixed electrode portion 886 and bonding layer fixed electrode portion 892 collectively form fixed electrode 140 of pressure sensor 102. Second substrate transducer layer portion 888 and bonding layer transducer layer portion 894 collectively form transducer layer 142 of inertial sensor 104. Second substrate connecting structure portion 890 and bonding layer connecting structure portion 896 collectively define connecting structure 132.

Bonding layer 140 is etched until sacrificial layer 130 is exposed. Sacrificial layer 130 operates as an etch stop for bonding layer 140.

Figure 10:
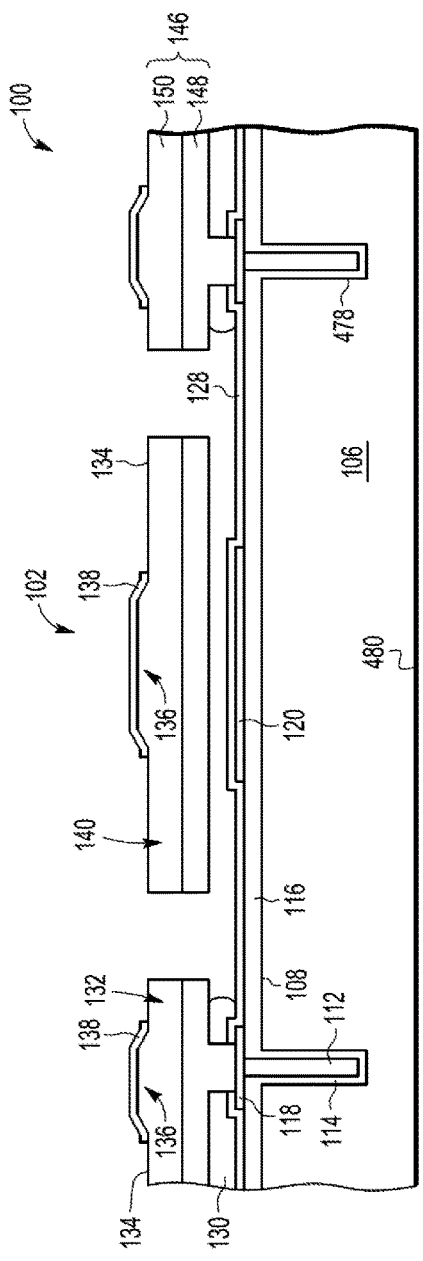
FIGS. 10 and 11 are cross-sectional views of the pressure sensor and the inertial sensor of FIGS. 8 and 9, respectively, at a further stage during fabrication in accordance with one embodiment.
Figure 11:
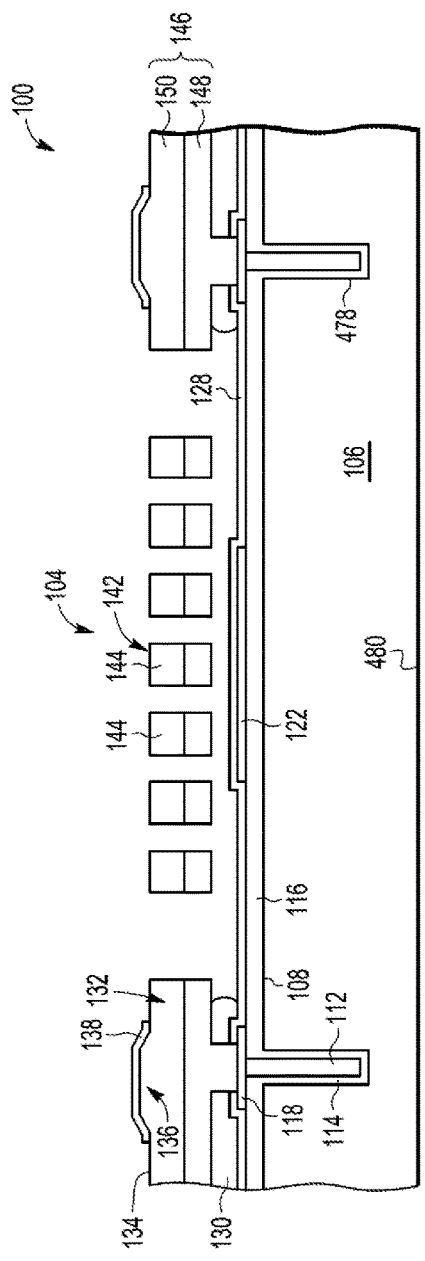

FIGS. 10 and 11 are cross-sectional views of pressure sensor 102 and inertial sensor 104 of FIGS. 8 and 9, respectively, at a further stage during fabrication in accordance with one embodiment. Referring now to FIGS. 8, 9, 10, and 11 together, sacrificial layer 130 is removed to release fixed electrode 140 and transducer layer 142 from first substrate 106. In one embodiment, sacrificial layer 130 is removed by etching in hydrofluoric acid vapor (vapor HF). In accordance with this embodiment, upper passivation layer 128, e.g., silicon nitride, is used as an etch stop during etching of sacrificial layer 130. Sacrificial layer 130 is etched for a sufficient amount of time to completely release fixed electrode 140 and transducer layer 142 while still ensuring that portions of sacrificial layer 130 remain below connecting structure 132. After being released, empty spaces exist between fixed electrode 140, transducer layer 142 and first substrate 106. The remaining portion of sacrificial layer 130 below connecting structure 132 operates as a seal between connecting structure 132 and first substrate 106. Connecting structure 132 at least partially overhangs sacrificial layer 130 in one embodiment.

Figure 12:
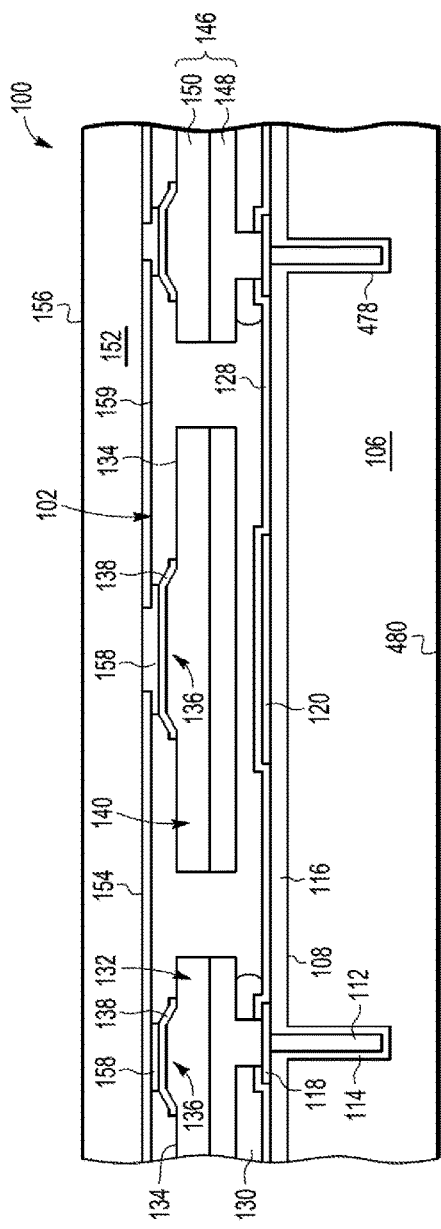
FIGS. 12 and 13 are cross-sectional views of the pressure sensor and the inertial sensor of FIGS. 10 and 11, respectively, at a further stage during fabrication in accordance with one embodiment.
Figure 13:
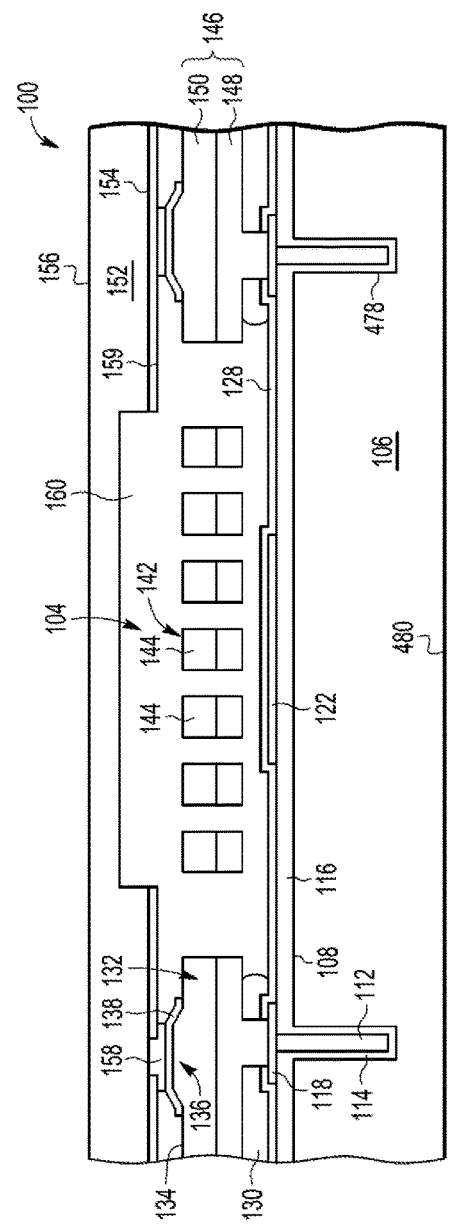

FIGS. 12 and 13 are cross-sectional views of pressure sensor 102 and inertial sensor 104 of FIGS. 10 and 11, respectively, at a further stage during fabrication in accordance with one embodiment. Referring now to FIGS. 12 and 13 together, third substrate 152 is provided having passivation layer 159 thereon, transducer layer cavity 160 formed therein, and contact pads 158 formed thereon. In one embodiment, passivation layer 159 with openings is formed on inner surface 154, contact pads 158 are formed on passivation layer 159, and transducer layer cavity 160 is formed. Third substrate 152 is bonded to second substrate 150 through aluminum germanium (AlGe) eutectic bonding of contact pads 158 and electrical contact layer 138.

Referring now to FIGS. 1, 12 and 13 together, outer sacrificial surface 480 (FIGS. 12-13) of first substrate 106 is thinned to expose vias 112 while at the same time defining outer surface 110 (FIG. 1) of first substrate 106. Lower passivation layer 124 is formed on outer surface 110 of first substrate 106 and patterned to expose vias 112. Lands 126 are formed on lower passivation layer 124 and within the openings of lower passivation layer 124 to contact and be electrically connected to vias 112.

Pressure sensor port 168 is then formed by etching lower passivation layer 124 and first substrate 106, e.g., using DRIE. In one embodiment, pressure sensor port 168 is formed by etching until insulation layer 116 is exposed. In another embodiment, first substrate 106 is only partially etched such that a pressure sensing diaphragm portion 176 of first substrate 106 remains between pressure sensor port 168 and insulation layer 116.

By monolithically integrating pressure sensor 102 with inertial sensor 104 within multi-sensor system 100, i.e., within a single fabrication platform, device footprint and costs are minimized by sharing process steps.

Although the invention is described herein with references to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multi-sensor system comprising:
   a first substrate;
   an insulating layer on the first substrate;
   a pressure sensor comprising:
      a movable electrode aligned with a pressure sensor port, the movable electrode being on the insulating layer, the pressure sensor port being within the first substrate, wherein the pressure sensor port extends partially through the first substrate, a pressure sensing diaphragm portion of the first substrate and a pressure sensor diaphragm portion of the insulating layer being between the pressure sensor port and the movable electrode; and
      a pressure sensor fixed electrode comprising a first portion of a second substrate; and
   an inertial sensor comprising:
      an inertial sensor fixed electrode on the insulating layer; and
      a transducer layer comprising a second portion of the second substrate.

2. The multi-sensor system of claim 1 further comprising:
   vias within the first substrate, the vias being configured to provide input/output signals to the pressure sensor and the inertial sensor.

3. The multi-sensor system of claim 1 further comprising:
   a third substrate sealing the inertial sensor and providing a hermetic reference cavity for the pressure sensor.

4. The multi-sensor system of claim 3 wherein the third substrate comprises a transducer layer cavity aligned with the transducer layer.

5. The multi-sensor system of claim 3 further comprising connecting structures comprising posts, the third substrate being mounted to the posts.

6. The multi-sensor system of claim 5 further comprising:
   a contact layer on the posts; and
   contact pads on the third substrate, the contact layer being bonded to the contact pads to thereby mount the third substrate to the posts.

7. The multi-sensor system of claim 1 further comprising a plurality of pressure sensors comprising the pressure sensor, the pressure sensors configured to measure different pressures.

* * * * *